(12) United States Patent
Kim et al.

(10) Patent No.: US 11,050,031 B2
(45) Date of Patent: Jun. 29, 2021

(54) NANOSCALE LIGHT EMITTING DIODE, AND METHODS OF MAKING SAME

(71) Applicant: UNIVERSITY OF PITTSBURGH-OF THE COMMONWEALTH SYSTEM OF HIGHER EDUCATION, Pittsburgh, PA (US)

(72) Inventors: Hong Koo Kim, Wexford, PA (US); Daud Hasan Emon, Hillsboro, OR (US)

(73) Assignee: University of Pittsburgh-Of the Commonwealth System of Higher Education, Pittsburgh, PA (US)

( * ) Notice: Subject to any disclaimer, the term of this patent is extended or adjusted under 35 U.S.C. 154(b) by 0 days.

(21) Appl. No.: 16/655,389

(22) Filed: Oct. 17, 2019

(65) Prior Publication Data
US 2020/0052233 A1   Feb. 13, 2020

Related U.S. Application Data

(62) Division of application No. 15/980,868, filed on May 16, 2018, now Pat. No. 10,529,938.

(51) Int. Cl.
*H01L 51/50* (2006.01)
*H01L 51/56* (2006.01)
(Continued)

(52) U.S. Cl.
CPC ............ *H01L 51/50* (2013.01); *H01L 51/502* (2013.01); *H01L 51/5004* (2013.01); *H01L 51/5056* (2013.01); *H01L 51/5096* (2013.01); *H01L 51/52* (2013.01); *H01L 51/56* (2013.01); *H01L 27/3246* (2013.01); *H01L 51/0037* (2013.01);
(Continued)

(58) Field of Classification Search
CPC ... H01L 51/502; H01L 51/50; H01L 51/0096; H01L 51/5004; H01L 51/5056; H01L 51/5072; H01L 51/5096
See application file for complete search history.

(56) References Cited

U.S. PATENT DOCUMENTS

2008/0248240 A1* 10/2008 Shi .................. H01L 51/5203
428/141
2011/0042657 A1* 2/2011 Shi .................. H01L 51/5092
257/40
(Continued)

OTHER PUBLICATIONS

Jeng Tzong Sheu et al., Selective Deposition of Gold Nanoparticles on SiO2/Si Nanowires for Molecule Detection, Citation: 2005 Jpn. J. Appl. Phys. 44 2864-2867.
(Continued)

*Primary Examiner* — Grant S Withers
(74) *Attorney, Agent, or Firm* — Philip E. Levy; Eckert Seamans Cherin & Mellott, LLC

(57) ABSTRACT

Various light emitting diode device embodiments that include emissive material elements, e.g., core-shell quantum dots, that are either (i) provided in nanoscale holes provided in an insulating layer positioned between an electron supply/transport layer and a hole supply/transport layer, or (ii) provided on a suspension layer positioned above and covering a nanoscale hole in such an insulating layer. Also, various methods of making such light emitting diode devices, including lithographic and non-lithographic methods.

13 Claims, 11 Drawing Sheets

(51) Int. Cl.
  *H01L 51/52* (2006.01)
  *H01L 51/00* (2006.01)
  *H01L 27/32* (2006.01)
(52) U.S. Cl.
  CPC ...... *H01L 51/0042* (2013.01); *H01L 51/0096* (2013.01); *H01L 51/5072* (2013.01)

(56) References Cited

U.S. PATENT DOCUMENTS

| | | | | |
|---|---|---|---|---|
| 2011/0163299 A1* | 7/2011 | Shi | ............... | H01L 51/0077 257/40 |
| 2012/0038066 A1* | 2/2012 | Blum | ............... | H01L 51/107 257/791 |
| 2012/0038067 A1* | 2/2012 | Blum | ............... | H01L 23/3192 257/792 |
| 2013/0214254 A1* | 8/2013 | Shi | ............... | H01L 51/5275 257/40 |

OTHER PUBLICATIONS

Daud Hasan Emon et al., Injection of 2D electron gas into a quantum-dot organic light-emitting diode structure on silicon substrate, Citation: Journal of Vacuum Science & Technology B 34, 06KJ01-1-06KJ01-6 (2016); doi: 10.1116/1.4964352.

Myungji Kim et al., Ultraviolet-enhanced photodetection in a graphene/SiO2/Si capacitor structure with a vacuum channel; Citation: Journal of Applied Physics 118, 104504-1-104504-7 (2015); doi: 10.1063/1.4930931.

Siwapon Srisonphan et al., Metal-oxide-semiconductor field-effect transistor with a vacuum channel; Citation: Nature Nanotechnology | vol. 7 | Aug. 2012 504 | www.nature.com/naturenanotechnology, 504-508.

Siwapon Srisonphan et al., Space charge neutralization by electron-transparent suspended graphene; Citation: Scientific Reports | 4 : 3764 | DOI: 10.1038/srep03764 1.

Jialong Zhao, Efficient CdSe/CdS Quantum Dot Light-Emitting Diodes Using a Thermally Polymerized Hole Transport Layer; Citation: NANO Letters 2006, vol. 6, No. 3, 463-467.

Seth Coe et al., Electroluminescence from single monolayers of nanocrystals in molecular organic devices; Citation: NATURE |vol. 420 | Dec. 19-26, 2002 |www.nature.com/nature.

Nir Tessler et al., Efficient Near-Infrared Polymer Nanocrystal Light-Emitting Diodes, Citation: Science, vol. 295, Feb. 22, 2002, pp. 1506-1508.

V.L. Colvin et al., Light-emitting diodes made from cadmium selenide nanocrystals and a semiconducting polymer; Citation: Nature, vol. 370, Aug. 4, 1994, pp. 354-357.

* cited by examiner

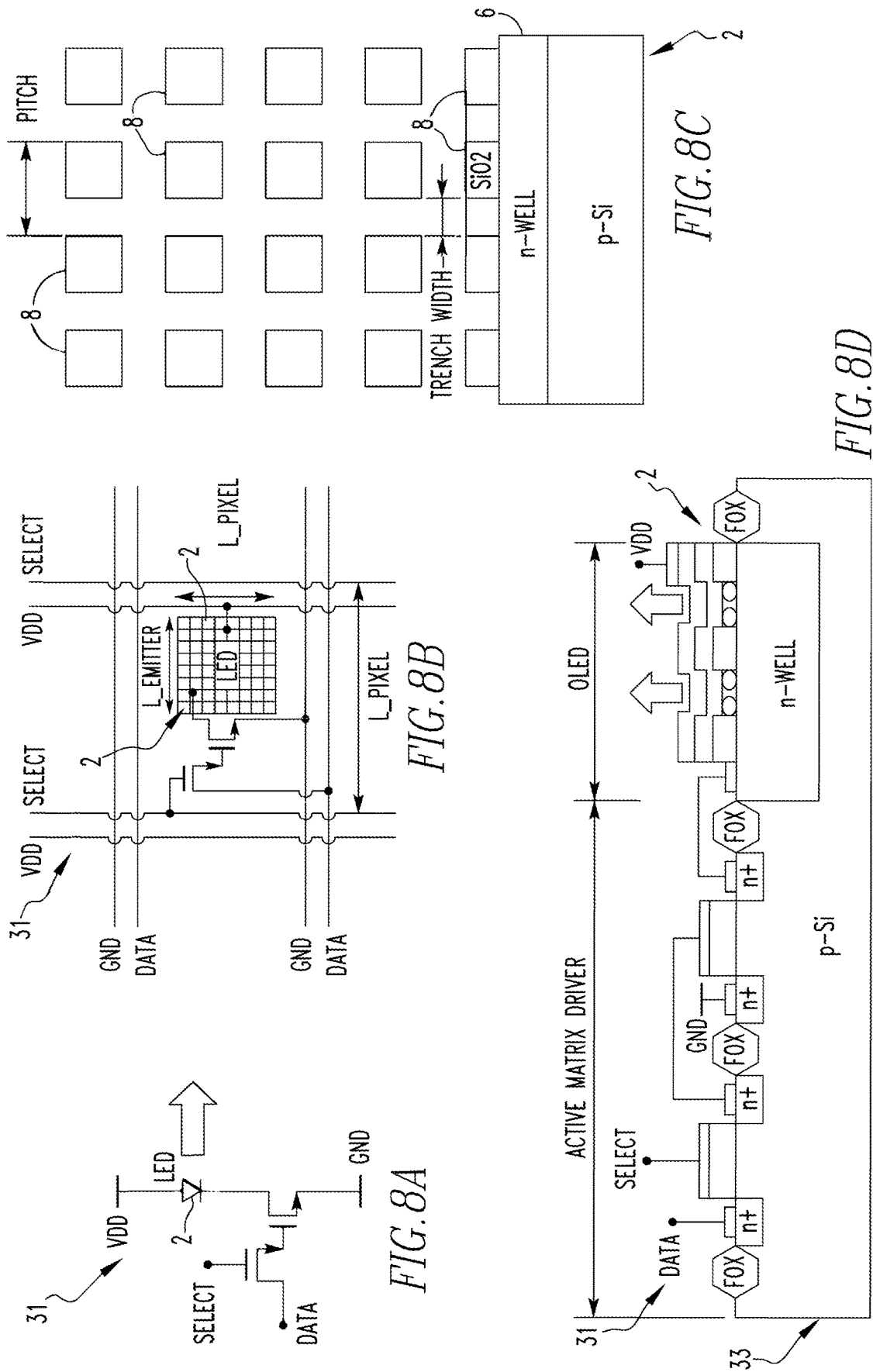

NANOSCALE LIGHT EMITTING DIODE, AND METHODS OF MAKING SAME

CROSS-REFERENCE TO RELATED APPLICATIONS

This is a Divisional Application of U.S. patent application Ser. No. 15/980,868, filed on May 16, 2018, which claimed priority under 35 U.S.C. § 119(e) from U.S. Provisional Patent Application No. 62/507,878, entitled "Nanoscale Light Emitting Diode" filed on May 18, 2017, the contents of which are incorporated herein by reference.

GOVERNMENT CONTRACT

This invention was made with government support under grant #ECCS0925532 awarded by the National Science Foundation (NSF) and/or grant #N00014-13-1-0465 awarded by the United States Department of the Navy/Office of Naval Research (ONR). The government has certain rights in the invention.

BACKGROUND OF THE INVENTION

1. Field of the Invention

The disclosed concept relates to light emitting diode (LED) devices, and, in particular, to scalable, high-efficiency nanoscale light emitting diode devices, and lithographic and non-lithographic methods of making same.

2. Description of the Related Art

High-resolution and high-efficiency microdisplays are critical components in developing smart wearables such as smart glasses, head-mount displays, and wearable computers. For a portable system supplied with a limited battery capacity, developing a low-power, high-brightness pixel technology for such a microdisplay is known to be a challenging task, since the conventional/emerging technologies offer only limited capabilities.

One example technology that may be used to implement microdisplays is a liquid-crystal on silicon (LCoS) display. An LCoS display, however, requires an external light source (backlight) that constantly draws a significant level of current. Another example technology that may be used to implement microdisplays is a micro-organic-light-emitting-diode (µ-OLED) display. As an emissive device that does not require backlight illumination, an µ-OLED display offers better efficiency than an LCoS display. However, the brightness of current µ-OLED displays is low and the lifetime of µ-OLED displays is limited. Still another example technology that may be used to implement microdisplays is GaN-based micro-LED technology. While GaN-based micro-LED technology offers high efficiency and brightness and a long lifetime, the scalability of pixel dimensions and the ability to integrate with driver electronics are limited.

SUMMARY OF THE INVENTION

In one embodiment, a light emitting diode device is provided that includes an electron supply/transport layer, a hole supply/transport layer, an insulating layer provided between the electron supply/transport layer and the hole supply/transport layer, the insulating layer having a nanoscale hole provided therein, and a number of emissive material elements provided in the nanoscale hole. The light emitting diode is structured such that responsive to forward bias conditions being applied to the light emitting diode a 2D electron gas forms at an interface of the electron supply/transport layer and the insulating layer and is injected into the number of emissive material elements at a periphery of the nanoscale hole.

In another embodiment, a method of making a light emitting diode device is provided. The method includes providing an electron supply/transport layer, providing an insulating layer on the electron supply/transport, the insulating layer having a nanoscale hole provided therein, providing a number of emissive material elements in the nanoscale hole, and providing a hole supply/transport layer on the number of emissive material elements. The light emitting diode so formed is structured such that responsive to forward bias conditions being applied to the light emitting diode a 2D electron gas forms at an interface of the electron supply/transport layer and the insulating layer and is injected into the number of emissive material elements at a periphery of the nanoscale hole.

In yet another embodiment, a light emitting diode device is provided that includes an electron supply/transport layer, an insulating layer provided on the electron supply/transport layer, the insulating layer having a nanoscale hole provided therein, a suspension layer provided on the insulating layer, wherein a portion of the suspension layer is positioned above and covers the nanoscale hole without filling the nanoscale hole, a number of emissive material elements provided on the suspension layer, and a hole supply/transport layer provided on the suspension layer and over the number of emissive material elements.

In a further embodiment, a method of creating a nano-channel substrate is provided that includes steps of providing a material including a substrate, a first oxide layer on the substrate, and a plurality of nanoscale oxygen blocking particles on the first oxide layer, removing the first oxide layer and sinking the nanoscale oxygen blocking particles into the substrate, oxidizing the substrate having the nanoscale oxygen blocking particles sunk therein to create a second oxide layer on the substrate, the second oxide layer having at least a portion of each of the nanoscale oxygen blocking particles embedded therein, and removing the nanoscale oxygen blocking particles from the second oxide layer and leaving a plurality of nanoscale holes in the second oxide layer.

In still a further embodiment, a method of creating a nano-channel substrate is provided that includes steps of providing a material including a substrate, an oxide layer on the substrate, and a plurality of nanoscale oxygen blocking particles on the oxide layer, depositing a dielectric layer on the oxide layer, the dielectric layer not completely covering the nanoscale oxygen blocking particles such that the dielectric layer has only a portion of each of the nanoscale oxygen blocking particles embedded therein, removing the nanoscale oxygen blocking particles from the dielectric layer and leaving a plurality of nanoscale openings in the dielectric layer, removing portions of the oxide layer through the nanoscale openings to create a plurality of nanoscale holes in the oxide layer, and removing the dielectric layer having the plurality of nanoscale openings therein from the oxide layer.

BRIEF DESCRIPTION OF THE DRAWINGS

FIGS. 8A-8D are schematic diagrams illustrating a global configuration of an LED array monolithically integrated with active-matrix driver circuits on a Si-CMOS chip according to a specific exemplary embodiment;

DETAILED DESCRIPTION OF EXEMPLARY EMBODIMENTS

Figure 1:
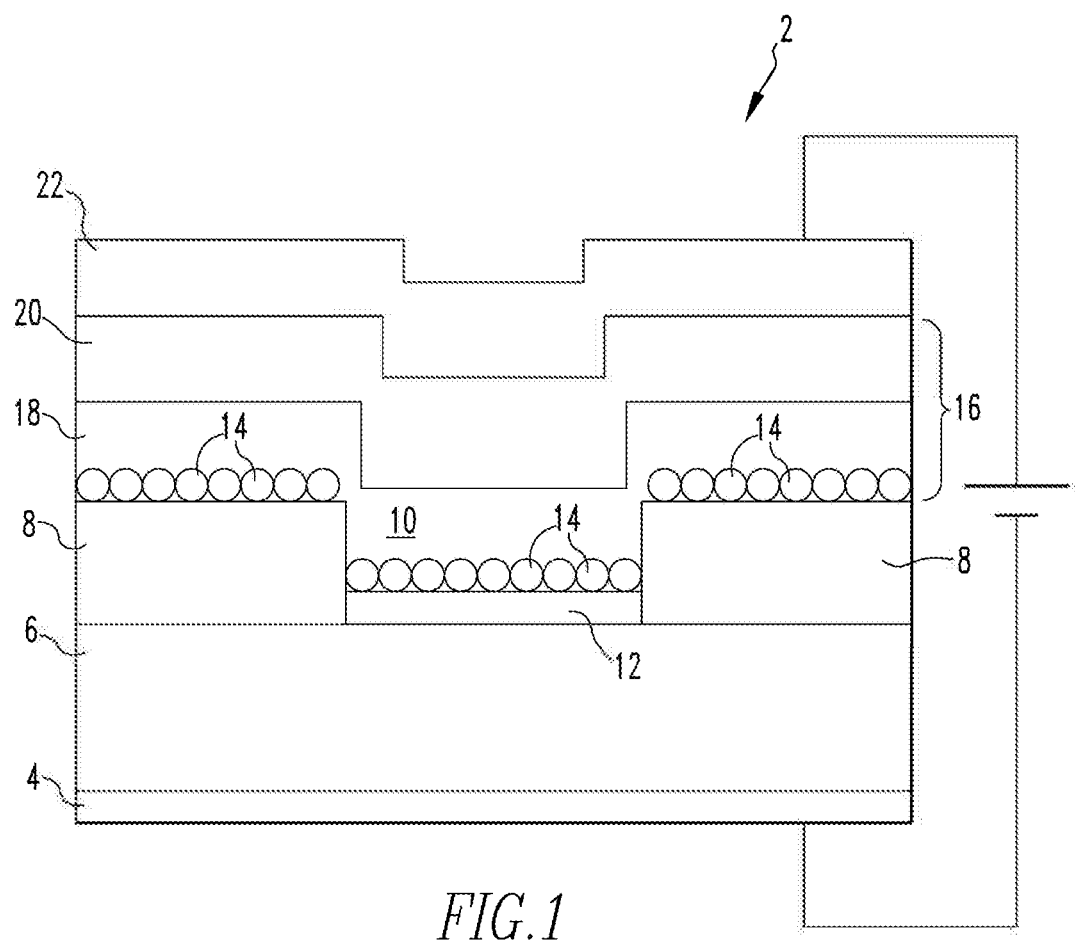
FIG. 1 is a schematic diagram of an LED device according to an exemplary embodiment of the disclosed concept.

As used herein, the singular form of "a", "an", and "the" include plural references unless the context clearly dictates otherwise.

As used herein, the statement that two or more parts or components are "coupled" shall mean that the parts are joined or operate together either directly or indirectly, i.e., through one or more intermediate parts or components, so long as a link occurs.

As used herein, "directly coupled" means that two elements are directly in contact with each other.

As used herein, the term "number" shall mean one or an integer greater than one (i.e., a plurality).

As used herein, the term "nanoscale" shall mean an object having a size (e.g., diameter or width) ranging from 1 nm to 300 nm.

As used herein, the term "emissive material" shall mean a material that exhibits electroluminescence wherein, in response to application of an electric bias for carrier injection, energy in the form of photons is released from the material as a result of electrons recombining with holes within the material.

As used herein, the term "core-shell quantum dot" shall mean a nanocrystal material having a quantum dot surrounded by a shell of another type of semiconducting material.

As used herein, the term "quantum dot" shall mean a nanoscale semiconductor particle.

Directional phrases used herein, such as, for example and without limitation, top, bottom, left, right, upper, lower, front, back, and derivatives thereof, relate to the orientation of the elements shown in the drawings and are not limiting upon the claims unless expressly recited therein.

The disclosed concept will now be described, for purposes of explanation, in connection with numerous specific details in order to provide a thorough understanding of the subject innovation. It will be evident, however, that the disclosed concept can be practiced without these specific details without departing from the spirit and scope of this innovation.

The disclosed concept provides a new type of light-emitting-device (LED) structure that will allow: (i) wide-range scalability of lateral dimensions (i.e., junction diameters down to the nanometer range, $<\sim 10$ nm), (ii) high-efficiency carrier injection and confinement into nanometer-scale emissive material, and (iii) precise control of placement of nanoscale emissive materials at predetermined locations (with nm accuracy). More specifically, the disclosed LED structure is scalable to a nanometer range at an individual emitter level and may be integrated into a chip-scale array (e.g., <1 cm, with megapixels) on the same platform as driver electronics, while at the same time providing high energy-efficiency (e.g., >1 mW optical output for <10 mA injection current at chip level). The disclosed LED structure is designed to allow both highly localized injection of carriers into nanoscale emissive material and strong confinement of injected carriers, therefore providing high quantum efficiency of electrical to optical conversion. The nano-LED structure of the disclosed concept is thus expected to find useful applications in the areas of display and optical information processing. In particular, the nano-LED structure of the disclosed concept is expected to be particularly useful in connection with microdisplays, where high efficiency (i.e., high brightness and low-power consumption) and small size pixels (i.e., high pixel-density and high resolution) are commonly required, and in quantum information processing, where precisely-controlled emission of single photons is required.

FIG. 1 is a schematic diagram of an LED device 2 according to an exemplary embodiment of the disclosed concept. As described in greater detail herein, LED device 2 is a multi-layer structure that includes nanoscale emissive material deposited in a nanoscale hole. As seen in FIG. 1, LED device 2 includes a base electrode 4. In the exemplary embodiment, base electrode 4 acts as a cathode for LED device 2. An electron supply/transport layer 6 is provided on top of base electrode 4. A nano-hole array insulating layer 8 is provided on top of electron supply/transport layer 6. Nano-hole array insulating layer 8 includes a nanoscale hole 10. A hole blocking layer 12 is provided within nanoscale hole 10 on top of electron supply/transport layer 6. A plurality of emissive material elements 14 are provided in nanoscale hole 10 on top of hole blocking layer 12. In addition, as seen in FIG. 1, a plurality of emissive material elements 14 may also exist on top of nano-hole array insulating layer 8 outside of the region of nanoscale hole 10 (such additional emissive material elements 14 are not necessary for LED operation as they are not supplied with electrons and do not contribute to light emission; they may be present, however, as a result of a spin coating or similar process being used to deposit the emissive material elements 14 during manufacture). A hole supply/transport portion 16 comprising a first hole supply/transport layer 18 and a second hole supply/transport layer 20 is provided on top of the plurality of emissive material elements 14 over the nano-hole array insulating layer 8 and nanoscale hole 10. Finally, a transparent electrode 22 is provided on top of hole supply/transport portion 16. Transparent electrode 22 acts as an anode for LED device 2.

In operation, under forward bias conditions, electrons get injected from electron supply/transport layer 6 into nanoscale hole 10 and into emissive material elements 14. In particular, in the structure of LED device 2, electrons are designed to inject primarily from the periphery of the bottom of nanoscale hole 10 as a result of a 2D electron gas (2DEG) accumulating at the interface between electron supply/transport layer 6 and nano-hole array insulating layer 8 (owing to the Coulombic repulsion among electrons at the nanohole edges, the accumulated 2DEG injects into the emissive material elements 14). It is noteworthy that as the hole diameter is reduced to a deep nanometer scale, the junction edge area (i.e., the periphery part, where the 2DEG injects) becomes dominant over the hole bottom area. Also the Coulombic repulsion among electrons at the junction periphery has the effect of reducing the energy barrier for electron injection into emissive elements, enabling low voltage operation of LED. In other words, the injection of the accumulated 2DEG at the junction periphery is the dominant mechanism of carrier injection into emissive material elements 14 confined in nanoscale hole 10. In addition, under the same forward bias, holes get injected from hole supply/transport portion 16 into nanoscale hole 10 and into emissive material elements 14. This electron and hole injection causes electrons and holes to combine radiatively within emissive material elements 14 and thereby cause the emission of light from emissive material elements 14.

In the exemplary embodiment, nano-hole array insulating layer 8 is provided with a sufficient thickness so as to prevent the tunneling of carriers through nano-hole array insulating layer 8. Furthermore, holes injected down from hole supply/transport portion 16 will get confined/trapped by hole barrier layer 12.

Figure 2A:
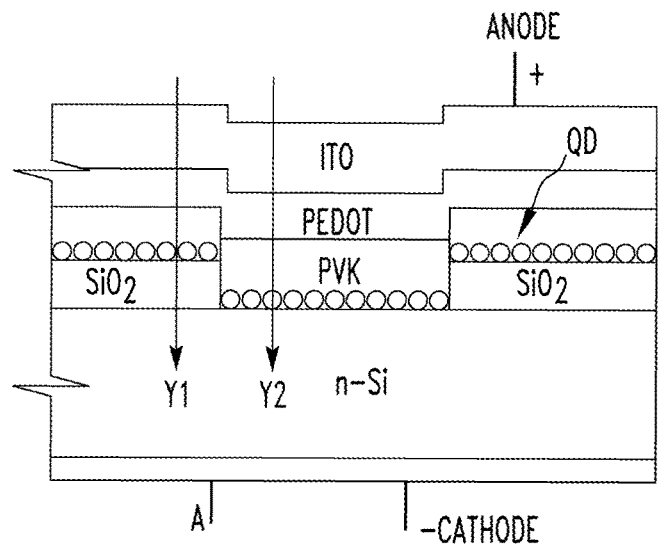
FIG. 2A is a schematic diagram of the LED device of FIG. 1 according to a particular exemplary embodiment.
Figure 2B:
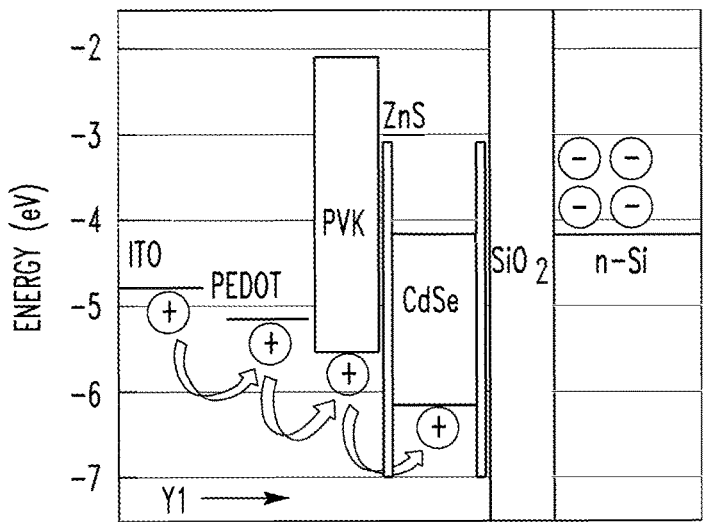
FIGS. 2B and 2C are schematic band diagrams of the LED device of FIG. 2.
Figure 2C:
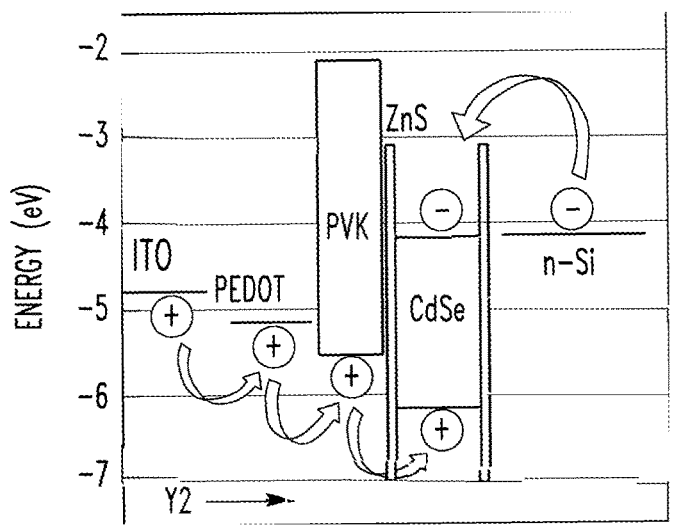

In one particular, non-limiting exemplary embodiment of LED device 2, shown in FIG. 2A, base electrode 4 is an aluminum electrode, electron supply/transport layer 6 is in an n-type silicon substrate, nano-hole array insulating layer 8 is an $SiO_2$ layer having nanoscale hole 10 provided therein, hole blocking layer 12 is a zinc oxide or titanium dioxide layer, emissive materials 14 are core-shell quantum dots, first hole supply/transport layer 18 is a layer of poly-(N-vinyl carbazole) (PVK) material, second hole supply/transport layer 20 is a layer of or poly(3,4-ethylenedioxythiophene) polystyrene sulfonate (PEDOT:PSS), and transparent electrode 22 is made of indium tin oxide (ITO). In this particular exemplary embodiment, PVK is used as first hole supply/transport layer 18 (as well as an electron blocking layer) due to its low HOMO and high LUMO level, and PEDOT:PSS is used as a buffer layer to increase anode work function and to reduce surface damage by a sputtered anode film. In one particular implementation, emissive materials 14 are CdSe/ZnS core-shell quantum dots. FIG. 2B shows a band diagram of this exemplary LED device 2 in the field oxide area and FIG. 2C shows a band diagram of this exemplary LED device 2 in the active device area.

Figure 3A:
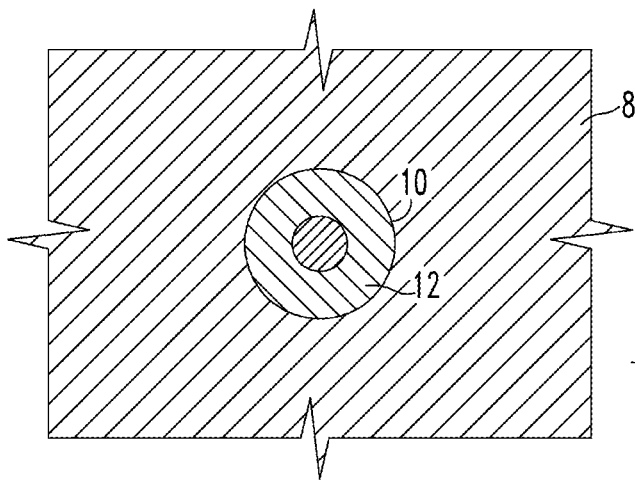
FIGS. 3A, 3B and 3C are schematic diagrams of portions of the LED device of FIG. 1 showing nanoscale holes having a variety of different shapes.
Figure 3B:
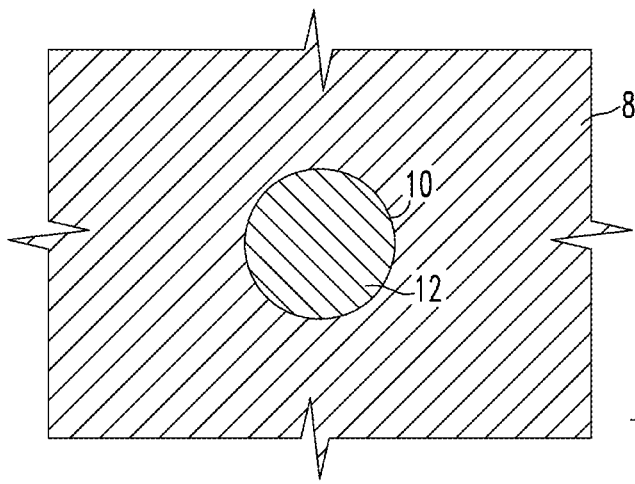
Figure 3C:
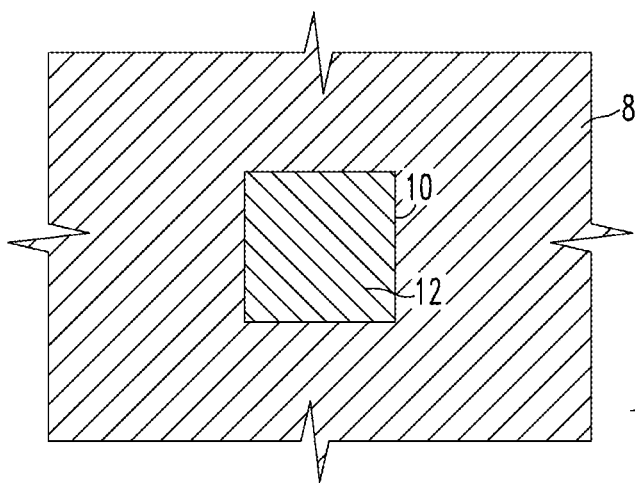

As noted elsewhere herein, nano-hole array insulating layer 8 includes a nanoscale hole 10 and a hole blocking layer 12 provided within nanoscale hole 10. Nanoscale hole 10 can have any of a variety of different shapes, including, without limitation, a round shape as shown in FIG. 3A, a square, rectangular or trench shape is shown in FIG. 3B and a ring shape as shown in FIG. 3C.

Figure 4:
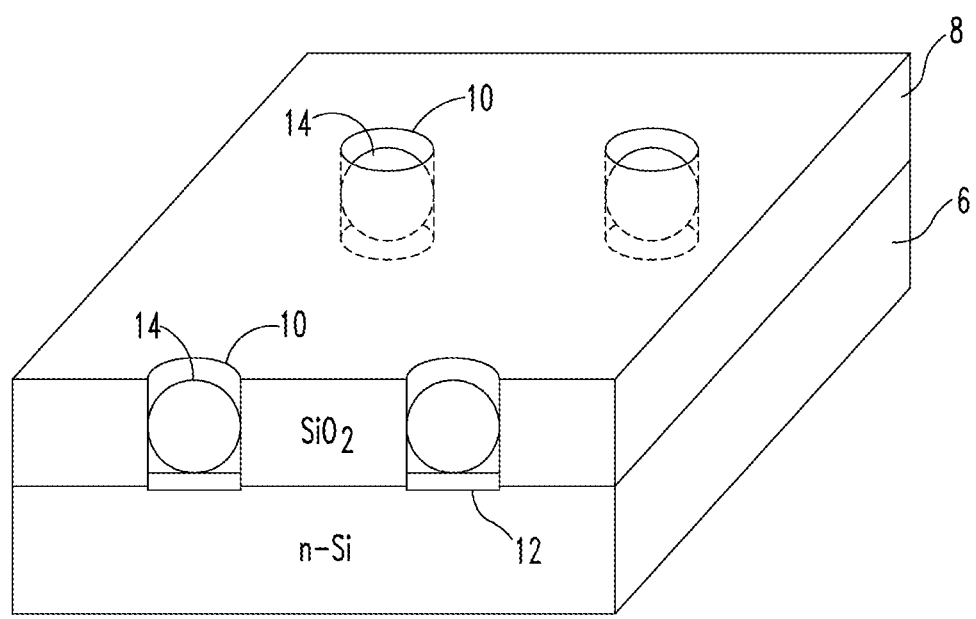
FIG. 4 is a schematic diagram of the LED device of FIG. 1 according to a another particular exemplary embodiment.

The typical diameter of a core-shell quantum dot is ~10 nm. FIG. 4 is a partial schematic diagram of an LED device according to one particular exemplary embodiment of the disclosed concept which, for ease of illustration, shows only electron supply/transport layer 6, nano-hole array insulating layer 8, nanoscale holes 10, hole barrier layers 12, and emissive materials 14. In FIG. 4, the hole diameter of each nanoscale holes 10 is further reduced to the range of ~10 nm such that each nanoscale hole 10 holds only a single emissive material element 14 in the form of a single core-shell quantum dot. With such a configuration, nano-OLEDs may be formed containing a single core-shell quantum dot at an individual emitter level as shown. Such a single-QD OLED can be used as a single-photon source on demand, which is considered to be an important optical component in quantum information processing.

In a further alternative embodiment, an exact or precise number of core-shell quantum dots may be placed in each nanoscale hole 10, and such number can be precisely controlled to a small particular number (e.g., 1-3) by properly designing the hole diameter or other size parameter of each nanoscale hole 10. A nano-OLED containing a smaller number of QDs can be utilized as a source of entangled photons in cluster state (multiqubits), which are important components for quantum computing and communication.

Figure 5A:
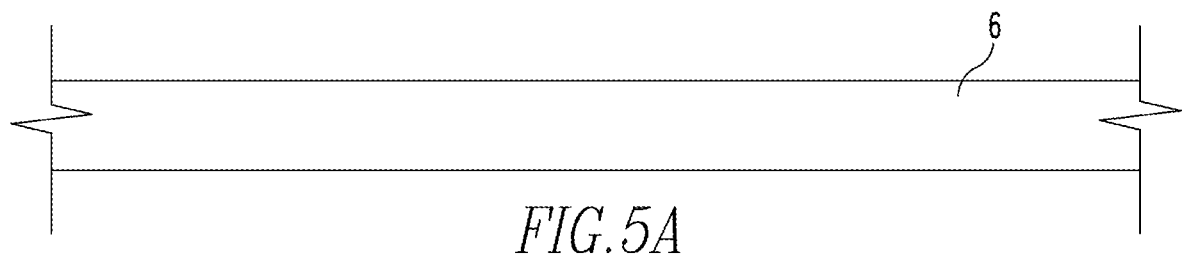
FIGS. 5A-5F are schematic diagrams illustrating a method of manufacturing an array of LED devices according to an exemplary embodiment of the disclosed concept.
Figure 5B:
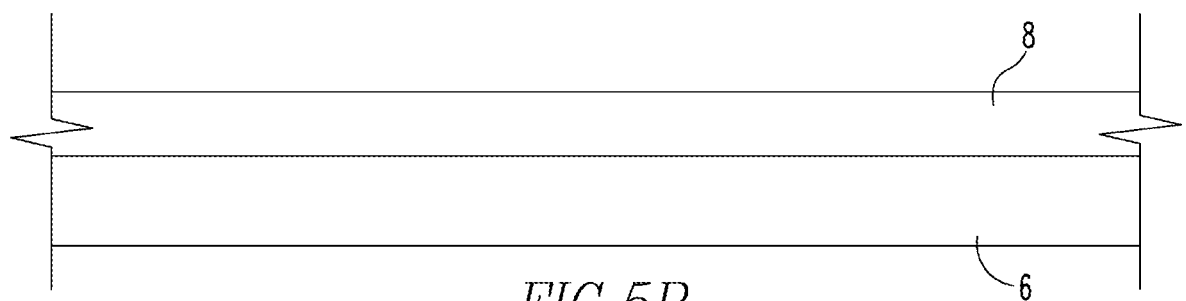
Figure 5C:
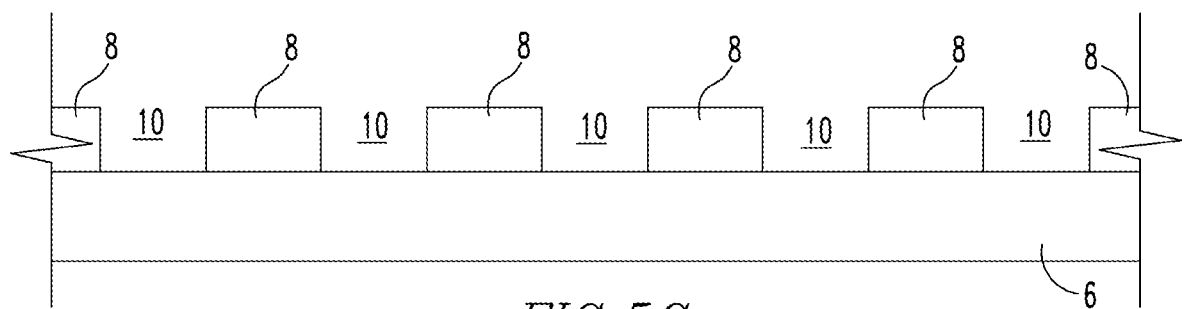
Figure 5D:
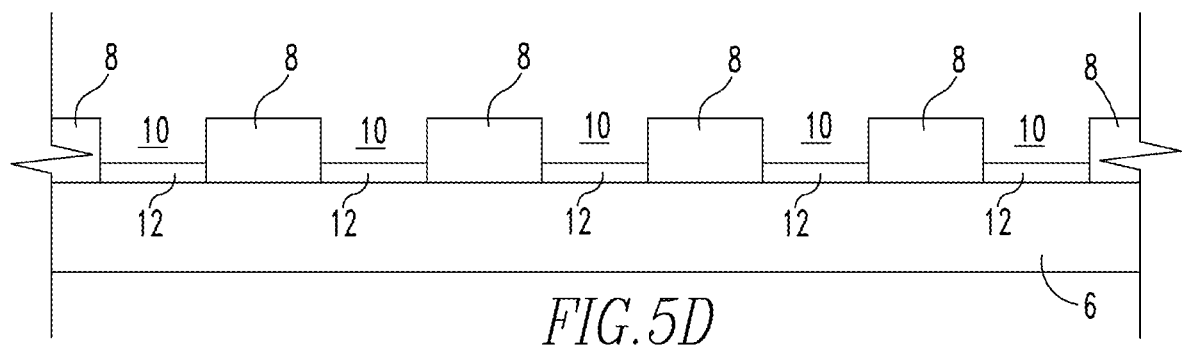
Figure 5E:
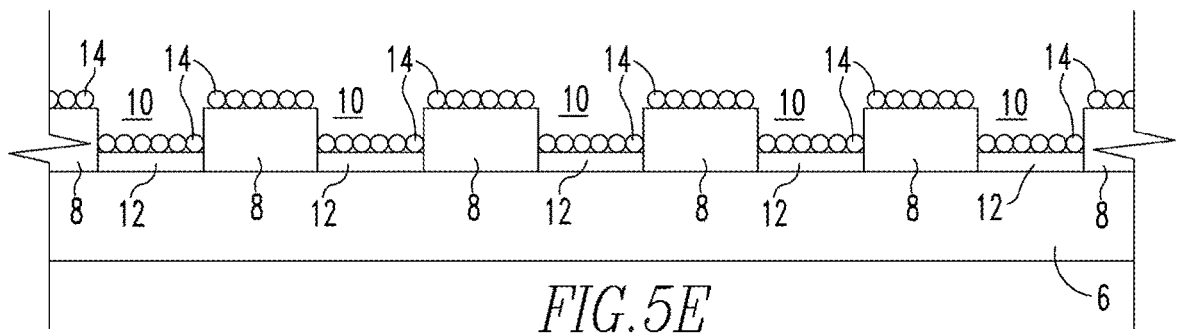
Figure 5F:
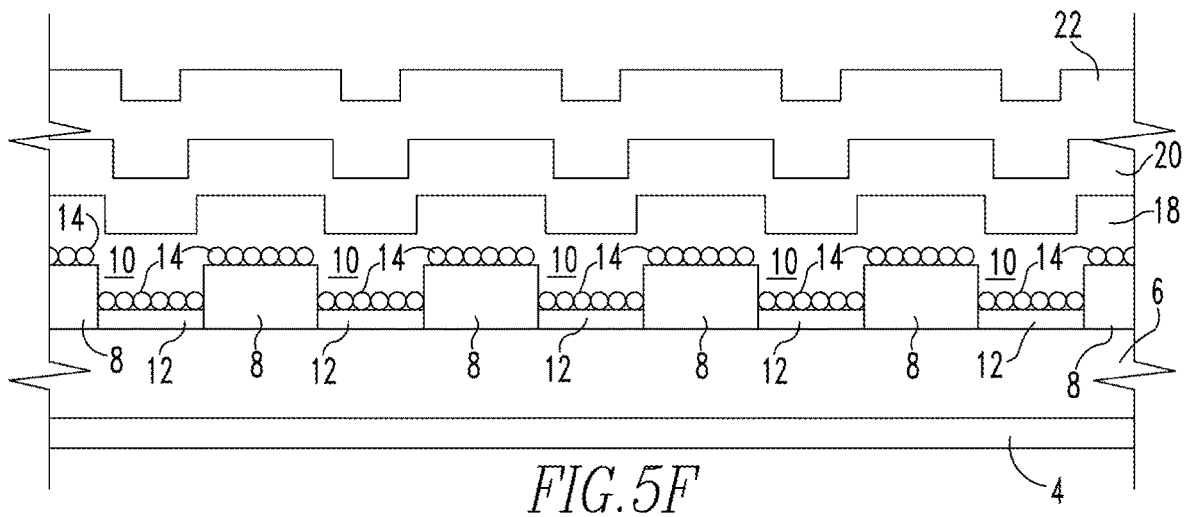

FIGS. 5A-5F illustrate a method of manufacturing an array of LED devices 2 according to an exemplary embodiment of the disclosed concept. An array manufactured in this manner could be used, for example, and without limitation, to implement a microdisplay. Referring to FIG. 5A, in the present exemplary embodiment, electron supply/transport layer 6 is provided in the form of an n-type silicon wafer acting as a substrate for the LED devices 2. Next, referring to FIG. 5B, $SiO_2$ is thermally grown on electron supply/transport layer 6. Then, referring to FIG. 5C, a plurality of nanoscale holes 10 are provided in the $SiO_2$ layer in order to form nano-hole array insulating layer 8. In the exemplary embodiment, nanoscale holes 10 are formed using photolithography and etching. In particular, by employing a nano-lithography technique, the dimensions of nanoscale holes 10 can be reduced down to the 10 nm range. Next, referring to FIG. 5D, hole blocking layer 12 is provided in each nanoscale hole 10 by a suitable technique such as a masking technique. Alternatively, hole blocking layer 12 may be provided over the entire top surface shown in FIG. 5C such that not only will it be present in each nanoscale hole 10, but it will also be present on the top surface of the $SiO_2$ layer, as the presence of hole blocking layer 12 at those additional parts will not affect the function of the LED devices 2. Then, referring to FIG. 5E, emissive material elements 14 are provided in each nanoscale hole 10 and on the top surface of the $SiO_2$ layer as shown. It should be noted here that the presence of emissive elements 14 on the $SiO_2$ layer 8 is not needed for LED operation. In the exemplary embodiment, a colloidal solution of core-shell quantum dots is spin coated on the surface shown in FIG. 5D as an emissive layer. Finally, as shown in FIG. 5F, first hole supply/transport layer 18, second hole supply/transport layer 20, and transparent electrode 22 are deposited, such as by sputtering or another suitable technique, on top of the structure shown in FIG. 5E. In addition, base electrode 4 is provided on the bottom surface of the structure shown in FIG. 5E. In the exemplary embodiment, transparent electrode 22 is patterned such that a plurality of individual electrodes are formed, each one corresponding to one of the nanoscale holes 10 confining emissive material elements 14. Such a configuration would allow each LED device 2 to be individually addressed using, for example and without limitation, an active matrix drive circuit. In addition, base electrode 4 and electron supply/transport layer 6 could also be patterned such that a subset of one or more of the nanoscale holes 10 correspond to each individually formed base electrode.

Figure 6:
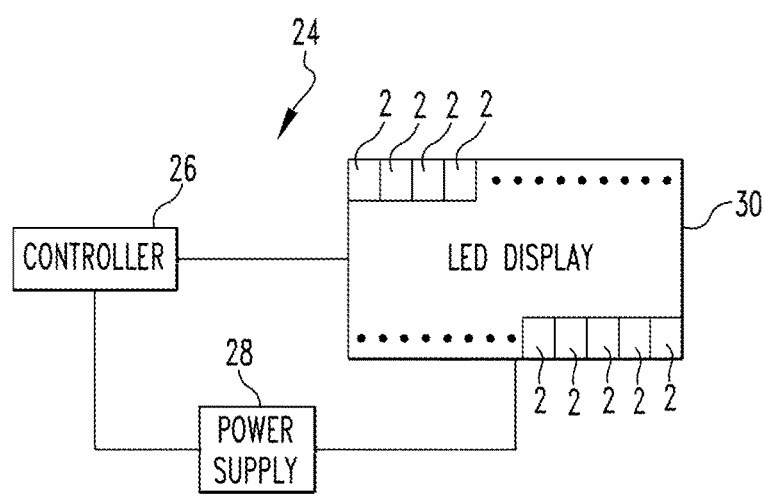
FIG. 6 is a schematic diagram of a microdisplay according to a further exemplary embodiment of the disclosed concept.

FIG. 6 is a schematic diagram of a microdisplay 24 according to a further exemplary embodiment of the disclosed concept. As seen in FIG. 6, microdisplay 24 includes a controller 26, such as, without limitation, a microprocessor, a microcontroller, or another suitable type of processing device, and a power supply 28. An LED display 30 is coupled to controller 26 and power supply 28. In the illustrated embodiment, LED display 30 includes an array of LED devices 2 as described herein arranged in a plurality of rows and columns. Each LED device 2 is LED display 30 is able to be independently controlled by controller 26. A microdisplay 24 as shown in FIG. 6 may be used as part of, for example, and without limitation, a pair of smart glasses, a head-mounted display, or a wearable computer.

Figure 7A:
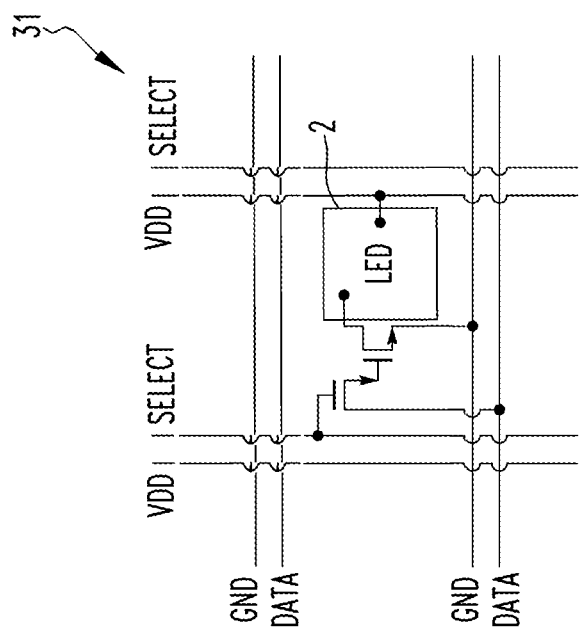
FIGS. 7A-7C are schematic diagrams illustrating an LED array integrated with active-matrix driver circuits that enables addressing/control of individual pixels according to a specific exemplary embodiment.
Figure 7B:
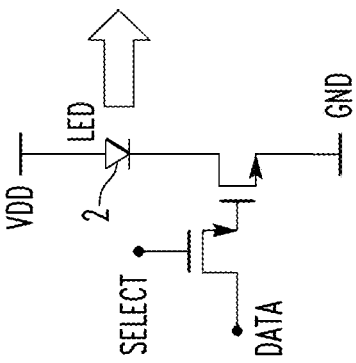
Figure 7C:
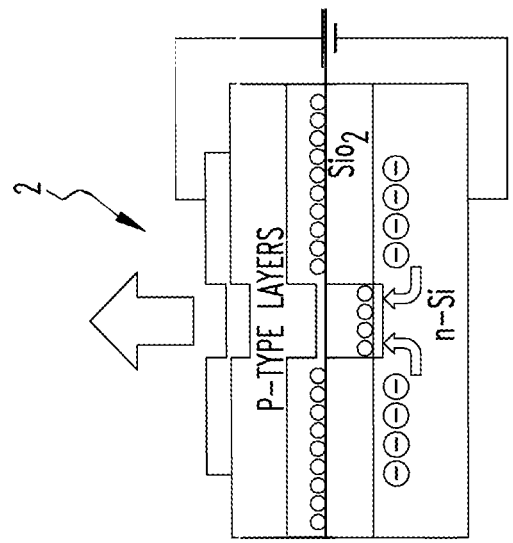

FIGS. 7A-7C are schematic diagrams illustrating an LED array integrated with active-matrix driver circuits 31 that enables addressing/control of individual pixels (e.g., individual LED devices 2) according to a specific exemplary embodiment. FIGS. 8A-8D are schematic diagrams illustrating a global configuration of an LED array monolithically integrated with active-matrix driver circuits 31 on Si-CMOS chip 33 according to a specific exemplary embodiment. The lateral dimension (trench width or hole diameter) of QD-OLED emitter can be varied in a wide range, from micrometer down to ~10 nm by employing nanopatterning/lithography techniques. The QD-OLED structure seen in FIG. 8 can be fabricated into an array with various different geometries (e.g., trench or hole), dimensions and fill factors (the ratio of opening area to unit area, i.e., trench width/pitch).

In one particular exemplary embodiment, the LED devices 2 of microdisplay 24 have nanoscale holes 10 that have a diameter of ~30 nm. Each such nanoscale hole 10 will be able to hold/trap three to four ~10 nm diameter core-shell quantum dots as described herein (emissive materials 14 are CdSe/ZnS core-shell quantum dots). In addition, each pixel in the exemplary microdisplay is 5 μm×5 μm, which includes an emitter area of 1 μm×1 μm per pixel and an active-matrix driver circuit for the remaining area of each pixel. The 1 μm×1 μm emitter area is designed to accommodate 100-1000 core-shell quantum dots. At a chip-level, this would translate to microdisplay 24 having a 5 mm×5 mm size, which comprises 1000×1000 pixels.

The spontaneous emission rate of a core-shell quantum dot is known to be on the order of 10 ns. Under ideal, balanced injection conditions, that is, assuming 100% injection efficiency, each core-shell quantum dot is expected to draw ~10 μA current. This further translates to the following conditions for the exemplary microdisplay 24 just described: 1-10 nA injection current to each pixel, and 1-10 mA injection current to a 1-mega-pixel microdisplay (5 mm×5 mm size). In an optimized quantum dot LED structure, the intrinsic quantum efficiency is expected to reach 100%. Taking into account the extraction efficiency (<1), an external quantum efficiency of ~50% is expected to be achievable for the exemplary microdisplay 24 just described (an EQE of ~20% has recently been reported with a QD-OLED structure.) The optical output of ~1-10 mW is then expected from this injection level.

With regard to brightness (i.e., optical output power normalized by emission area) of the exemplary microdisplay 24 just described, a more conservative estimate EQE of 10% may be assumed. At a single quantum dot level (~100 $nm^2$ cross-section), 2 pW optical output power is anticipated. This translates to a power density of $2 \times 10^4$ $W/m^2$. This can be compared to a power density of $2 \times 10^3$ $W/m^2$ for known GaN-based micro-LEDs. At a pixel level, the quantum dot emission area is diluted by 10-100 times (assuming diameter/spacing ratio for nanoscale holes 10 of ⅓-⅒), and the effective power density becomes 200-2000 $W/m^2$. At a chip level, the power density is further diluted to 10-100 $W/m^2$: emitter area of 1 μm×1 μm versus pixel area of 5 μm×5 μm). This microdisplay performance can be compared with existing/conventional technologies such as OLED displays (0.2 $W/m^2$) and LCD displays (0.1 $W/m^2$). Thus, overall, the exemplary microdisplay 24 of the disclosed concept is expected to offer 100-1000 times stronger brightness while consuming/drawing 10-100 times lower current (1-10 mA versus >100 mA).

Figure 9:
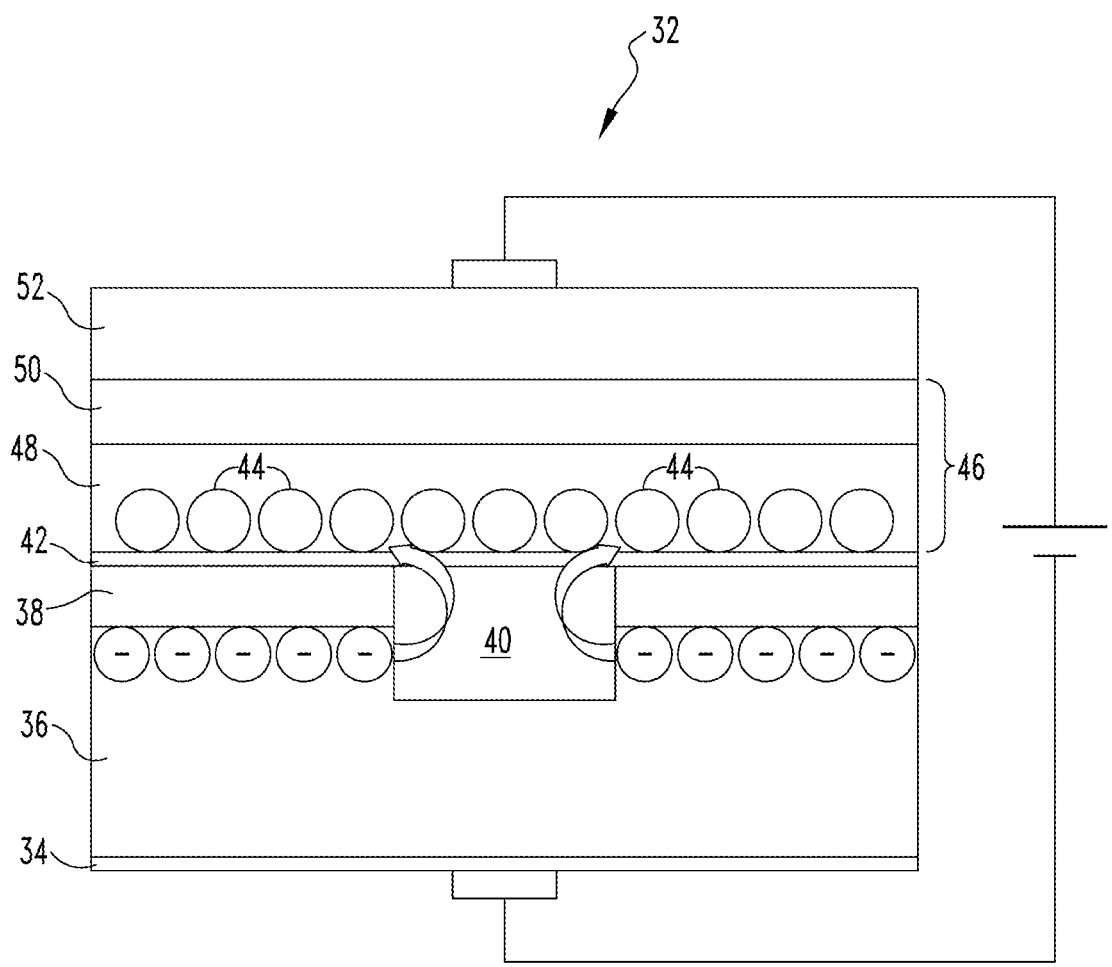
FIG. 9 is a schematic diagram of an LED device according to an alternative exemplary embodiment of the disclosed concept.

FIG. 9 is a schematic diagram of an LED device 32 according to an alternative exemplary embodiment of the disclosed concept. As described in greater detail herein, LED device 32 is a multi-layer structure that includes nanoscale emissive material suspended above a nanoscale hole by a suspension layer. LED device 32 may be used in place of LED devices 2 of microdisplay 24 described above.

One advantage of the embodiment of FIG. 9 is that optical outcoupling is improved because the emissive layer is suspended rather than being at the bottom of a shallow trench (FIG. 1). Another advantage of the embodiment of FIG. 6 is that it utilizes the unique two-dimensional electron gas (2DEG) injection mechanism demonstrated in nano-channel devices. This low voltage, low power and high density carrier injection mechanism is well established in graphene oxide semiconductor (GOS) devices with nano-channels. Electrons can travel through the vacuum, pass the suspension layer by direct tunneling, and reach the emissive layer. The advantage of vacuum channel conduction is that holes cannot transport through the vacuum channel and reach the cathode Si. In short, in the embodiment of FIG. 9, the vacuum channel formed between the Si and the OLED as described herein is expected to act as an effective hole blocking layer and a good electron transport layer.

As seen in FIG. 9, LED device 32 includes a base electrode 34. In the exemplary embodiment, base electrode 34 acts as a cathode for LED device 32. An electron supply/transport layer 36 is provided on top of base electrode 34. A nano-hole array insulating layer 38 is provided on top of electron supply/transport layer 36. Nano-hole array insulating layer 38 includes a nanoscale hole 40 (which may extend a bit into electron supply/transport layer 36 as shown). A suspension layer 42 is provided on nano-hole array insulating layer 38. As seen in FIG. 9, a portion of suspension layer 42 is positioned above and covers nanoscale hole 40 without filling nanoscale hole 40. A plurality of emissive material elements 44 are provided on top of suspension layer 42. A hole supply/transport portion 46 comprising a first hole supply/transport layer 48 and a second hole supply/transport layer 50 is provided on top of and over suspension layer 42 and the plurality of emissive material elements 44. Finally, a transparent electrode 52 is provided on top of hole supply/transport portion 46. Transparent electrode 52 acts as an anode for LED device 32.

In one particular, non-limiting exemplary embodiment of LED device 32, base electrode 34 is an aluminum electrode, electron supply/transport layer 36 is in an n-type silicon substrate, nano-hole array insulating layer 38 is an $SiO_2$ layer having nanoscale hole 40 provided therein, suspension layer 42 is hexagonal monolayer sheet, specifically, in the exemplary embodiment, a hexagonal boron nitride (h-BN) sheet, emissive materials 44 are core-shell quantum dots, first hole supply/transport layer 48 is a layer of poly-(N-vinyl carbazole) (PVK) material, second hole supply/transport layer 50 is a layer of or poly(3,4-ethylenedioxythiophene) polystyrene sulfonate (PEDOT:PSS), and transparent electrode 52 is made of indium tin oxide (ITO).

As described herein, the various LED device embodiments require as a part thereof a structure that includes an insulating/oxide layer, such as SiO2, provided on a substrate, such as n-type silicon, wherein an array or nanoscale holes is provided in at least the insulating/oxide layer (and possibly partially in the substrate). Such a structure is referred to herein as a nano-channel substrate. One method of forming such an nano-channel substrate, using photolithography (e.g., conventional nanolithography techniques such as e-beam lithography) and etching, has been described above in connection with 4A-4F. Although such conventional nanolithography techniques can yield well-controlled device positions dimensions, large-scale production of OLED structures may not be economically practical using such techniques. It is noted that individuals addressing nano-OLEDs is not a technical requirement in many envisioned applications. For example, one of the major applications would be high resolution displays and wearable devices and self where each micro pixel will consist of a few hundred nano-OLEDs. Another application nanoscale holes themselves optoelectronic devices with suspended 2D materials, for example a graphene photodiode where graphene is a suspended cathode on nanoscale holes formed in a Si/SiO$_2$ structure. In both such devices, nanoscale holes are mainly for their highly efficient manner (in) injection of charge carriers rather than their nanometer resolution. Therefore, precise control over the individual hole is not a necessary requirement.

Thus, a further aspect of the disclosed concept provides two non-lithographic methods for forming a nano-channel substrate, which may then be used for any of the above described devices and/or to form an LED 2 or LED 32 as described herein. Each of those methods is described below.

Figure 10:
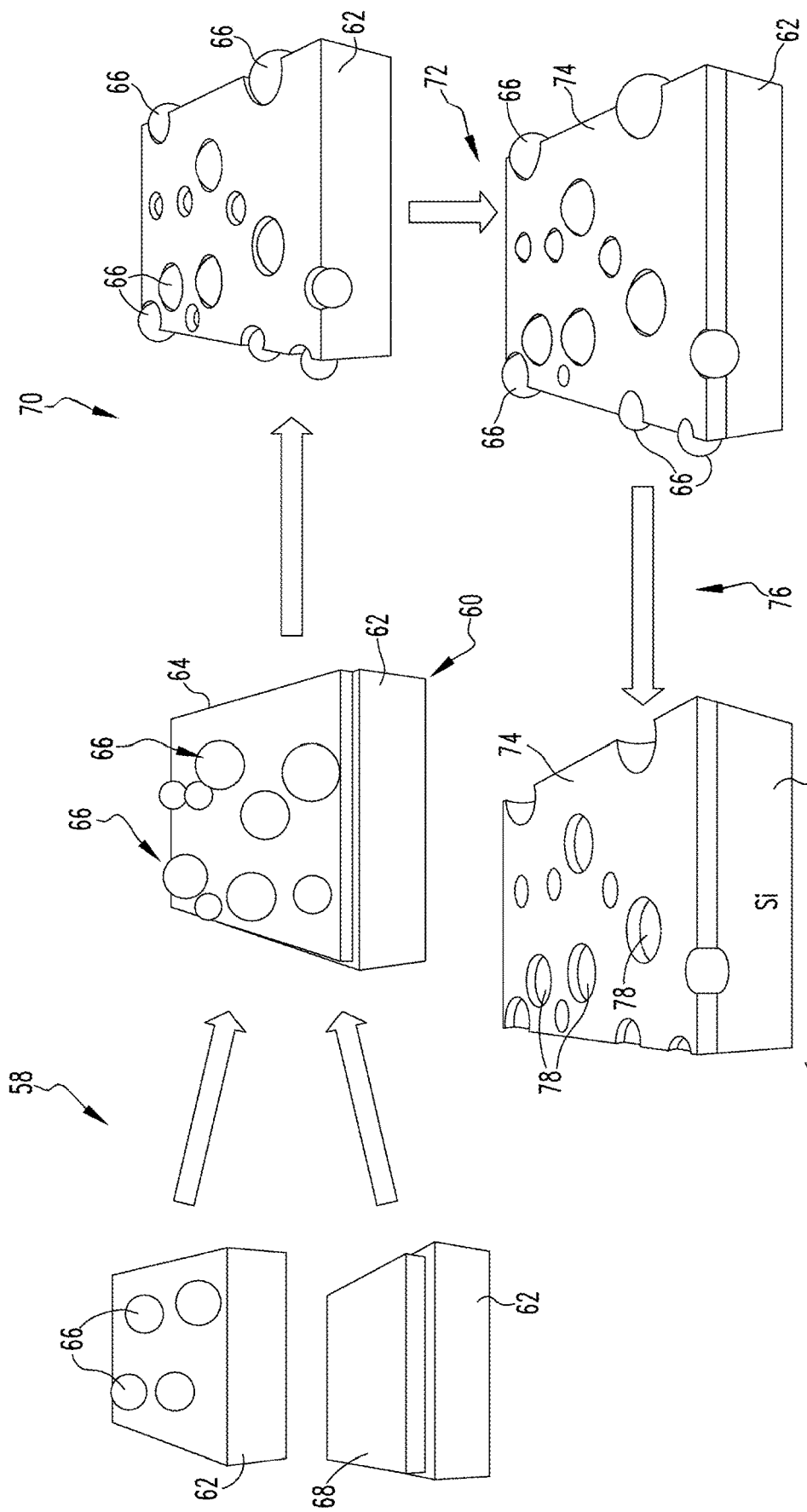
FIG. 10 is schematic diagram illustrating a method of manufacturing an LED device according to an alternative exemplary embodiment of the disclosed concept.

Referring to FIG. 10, a first non-lithographic method for forming a nano-channel substrate is illustrated schematically. In this method, as described in detail below nanoscale holes are patterned in SiO$_2$ by covering the silicon surface with nanoparticles to form a nanoparticle mask that can block oxygen from reaching underneath the silicon during high temperature thermal oxidation.

In a first step 58 of the method, a material assembly 60 is created that includes a substrate 62 (such as a n-type silicon substrate), an oxide layer 64 (such as a layer of SiO$_2$) provided on the top surface of substrate 62, and a plurality of nanoscale oxygen blocking particles 66 (such as gold nanoparticles) provided on oxide layer 64. Step 60 may, in one embodiment (see top illustration on upper left side of FIG. 10), be performed by providing substrate 62, depositing nanoscale oxygen blocking particles 66 directly on the surface of substrate 62 by a process such as spin coating (e.g., spin coating a colloidal solution of nanoscale particles), and thereafter thermally oxidizing substrate 62. The thermal oxidation will cause oxide layer 64 to be created with nanoscale oxygen blocking particles 66 resting on the top surface thereof, thereby forming material assembly 62. Alternatively, Step 58 may, in another embodiment (see bottom illustration on upper left side of FIG. 10), be performed by providing substrate 62 and depositing a thin film 68 of metal (e.g., gold thin film) on the top of substrate 62 using a process such as thermal evaporation. Thereafter, substrate 62 including thin film 68 is thermally oxidized (i.e., high temperature annealing), which causes oxide layer 64 to be created and which causes thin film 68 to break up as a result of a solid state dewetting (SSD) mechanism into nanoscale oxygen blocking particles 66 (e.g., gold nanoparticles) resting on the top surface of oxide layer 64, thereby forming material assembly 62. In one exemplary embodiment, nanoscale oxygen blocking particles 66 so formed have a diameter ranging from 20 nm to 200 nm, with a 10 nm to 100 nm spacing between them (when spin coating is used, the spacing between nanoparticles varies with solution density, generating a denser distribution for denser solutions).

Unexpectedly, it was found that during thermal oxidation of Si, oxygen can diffuse through contact gap between spherical nanoparticles and a Si substrate due to point contact nature of the nanoparticles. As a result, the Si area underneath the nanoparticles becomes oxidized, rendering the nanoparticle barrier mask ineffective for forming nanoholes. This problem was solved in according to an aspect of the disclosed concept by sinking the nanoparticles into the silicon. Specifically, in the next step of the method, step 70, oxide layer 64 is removed and nanoscale oxygen blocking particles 66 are sunk into substrate 64 as shown in FIG. 10. Step 70 may be performed using a metal-assisted chemical etching (MACE) process. Then, in step 72, substrate 62 with the sunken nanoscale oxygen blocking particles 66 is thermally re-oxidized to create an oxide layer 74 (e.g., SiO$_2$) on substrate 62. As seen in FIG. 10, oxide layer 74 will have at least a portion (e.g., about one-half the diameter) of each of the nanoscale oxygen blocking particles 62 embedded therein. Finally, in step 76, nanoscale oxygen blocking particles 66 are removed from oxide layer 74 (e.g., using an etching process using, for example, aqua regia). As a result, a plurality of nanoscale holes 78 are left in oxide layer 74, thereby creating a nano-channel substrate 80, which may then be used to form an LED 2 or LED 32 as described herein.

In one particular embodiment, a citrate-stabilized colloidal solution of gold nanoparticles may be used in step 58. At neutral pH, however, the negatively charged citrate ions coat individual gold particles, preventing agglomeration by coulomb repulsion. For the same reason, nanoparticles do not adhere to bare silicon, which also has a negatively charged surface. To overcome this adhesion problem, the pH of the nanoparticle colloidal solution was decreased in this embodiment. At lower pH, for example, at pH of 2, the citrate ions are expected to be converted to neutral citric acid. Based on this principle, concentrated HCl may be mixed with the nanoparticle solution in, for example, 1% volumetric ratio to decrease pH.

In another particular embodiment, the MACE etchant used in step 70 is an aqueous solution of HF and H$_2$O$_2$ with a volume ratio of 6% and 1% respectively. During MACE, gold catalyzes the reduction of H$_2$O$_2$ producing holes (h+). The holes (h+) are then injected into the Si valence band to form SiO$_2$ that is soluble in HF. This results in a directional etching of Si producing a hole with nanoscale diameter that is the same as the nanoparticle. After a mild MACE etching, a conformal contact between the lower half of a nanoparticle sphere and Si is formed at the hole bottom. In addition, an extra oxidation step may be performed before the MACE etching process.

Figure 11:
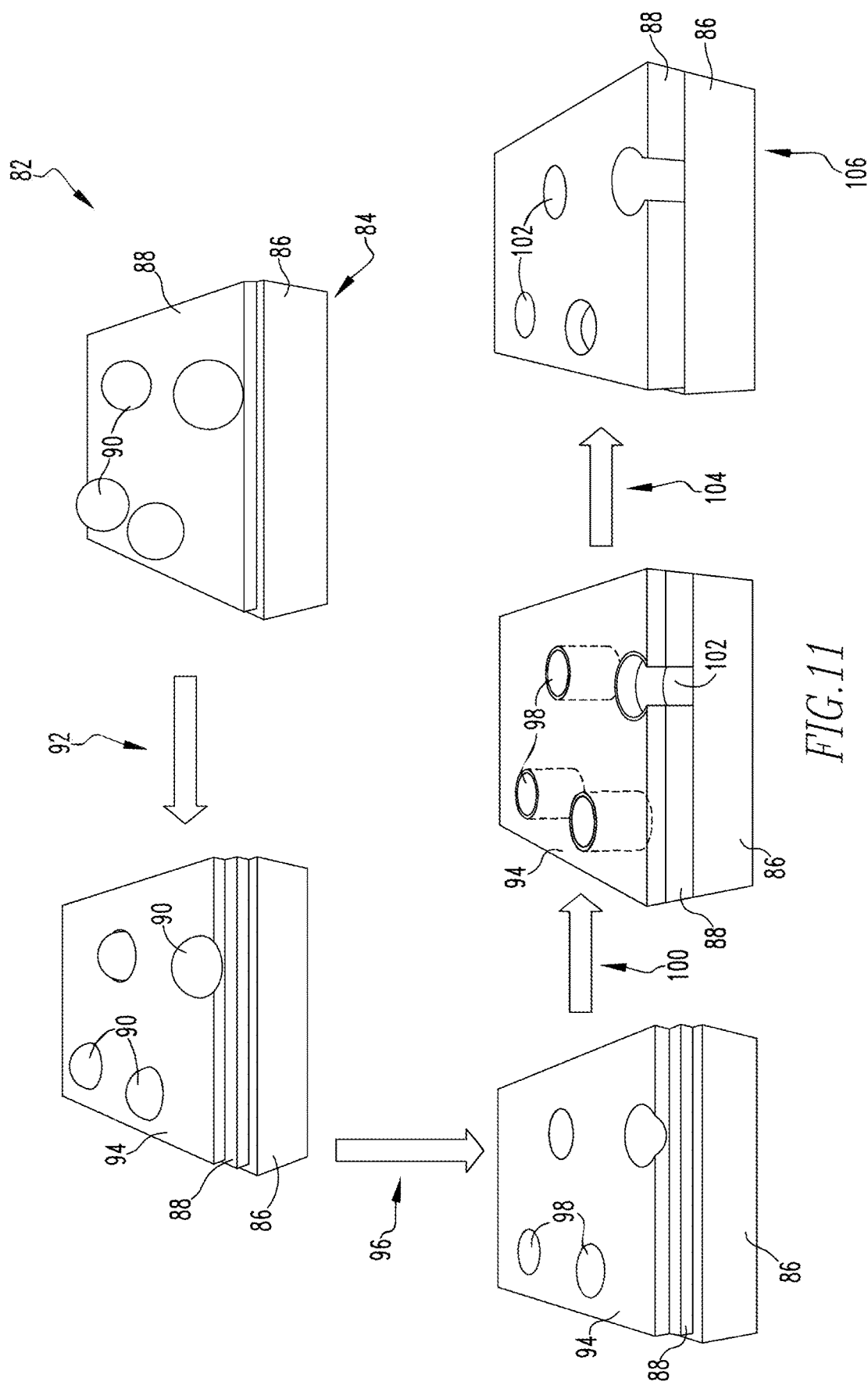
FIG. 11 is schematic diagram illustrating a method of manufacturing an LED device according to a further alternative exemplary embodiment of the disclosed concept.

Referring to FIG. 11, a second non-lithographic method for forming a nano-channel substrate is illustrated schematically. In a first step 82 of the method, a material assembly 84 that is identical to material assembly 60 is created as described herein. Material assembly 84 includes a substrate 86 (such as a n-type silicon substrate), an oxide layer 88 (such as a layer of SiO$_2$) provided on the top surface of substrate 86, and a plurality of nanoscale oxygen blocking particles 90 (such as gold nanoparticles) provided on oxide layer 88.

Next, in step 92, a dielectric layer 94 (such as a layer of alumina ($Al_2O_3$, which has a high etch resistivity and against gold and $SiO_2$ etchants) is deposited on top of oxide layer 88. A process such as RF sputtering may be used to deposit dielectric layer 94. As seen in FIG. 11, dielectric layer 94 is deposited in a manner such that it does not completely cover nanoscale oxygen blocking particles 90. As a result, dielectric layer 94 has only a portion (e.g., about one-half the diameter) of each of the nanoscale oxygen blocking particles 90 embedded therein. In step 96, nanoscale oxygen blocking particles 90 are then removed (e.g., using an etching process) from dielectric layer 94, leaving a plurality of nanoscale openings 98 (i.e., etching windows) in dielectric layer 94. Next, in step 100, portions of oxide layer 88 (and possibly portions of substrate 86) are removed through nanoscale openings 98 (e.g., using reactive ion etching) to create a plurality of nanoscale holes 102 in at least oxide layer 88 (and possibly in substrate 86). Finally, in step 104, dielectric layer 94 having the plurality of nanoscale openings 98 therein is removed, thereby creating a nano-channel substrate 106, which may then be used to form an LED 2 or LED 32 as described herein.

In the claims, any reference signs placed between parentheses shall not be construed as limiting the claim. The word "comprising" or "including" does not exclude the presence of elements or steps other than those listed in a claim. In a device claim enumerating several means, several of these means may be embodied by one and the same item of hardware. The word "a" or "an" preceding an element does not exclude the presence of a plurality of such elements. In any device claim enumerating several means, several of these means may be embodied by one and the same item of hardware. The mere fact that certain elements are recited in mutually different dependent claims does not indicate that these elements cannot be used in combination.

Although the invention has been described in detail for the purpose of illustration based on what is currently considered to be the most practical and preferred embodiments, it is to be understood that such detail is solely for that purpose and that the invention is not limited to the disclosed embodiments, but, on the contrary, is intended to cover modifications and equivalent arrangements that are within the spirit and scope of the appended claims. For example, it is to be understood that the present invention contemplates that, to the extent possible, one or more features of any embodiment can be combined with one or more features of any other embodiment.

What is claimed is:

1. A light emitting diode device, comprising:
   an electron supply/transport layer;
   a hole supply/transport layer;
   an insulating layer provided between the electron supply/transport layer and the hole supply/transport layer, the insulating layer having a nanoscale hole provided therein; and
   a number of emissive material elements provided in the nanoscale hole, wherein the light emitting diode is structured such that responsive to forward bias conditions being applied to the light emitting diode a 2D electron gas forms at an interface of the electron supply/transport layer and the insulating layer and is injected into the number of emissive material elements at a periphery of the nanoscale hole.

2. The light emitting diode device according to claim 1, wherein each of the number of emissive material elements is a core-shell quantum dot.

3. The light emitting diode device according to claim 2, wherein each core-shell quantum dot is a CdSe/ZnS core-shell quantum dot.

4. The light emitting diode device according to claim 2, wherein the number of emissive elements is a single emissive material element.

5. The light emitting diode device according to claim 2, wherein the number of emissive elements is three or less to enable light emitting diode device to function as a source of entangled photons in a multiqubit cluster state.

6. The light emitting diode device according to claim 1, further comprising a transparent electrode provided on top of the hole supply/transport layer and a base electrode provided beneath the electron supply/transport layer.

7. The light emitting diode device according to claim 6, wherein the transparent electrode comprises an indium tin oxide electrode.

8. The light emitting diode device according to claim 1, wherein the electron supply/transport layer comprises a silicon substrate.

9. The light emitting diode device according to claim 8, wherein the electron supply/transport layer comprises an n-type silicon substrate.

10. The light emitting diode device according to claim 1, wherein the hole supply/transport layer comprises a first layer including PVK and a second layer including PEDOT:PSS provided on the first layer.

11. The light emitting diode device according to claim 1, further comprising a hole blocking layer provided in the nanoscale hole between the number of emmisive material elements and the electron supply/transport layer.

12. The light emitting diode device according to claim 11, wherein the hole blocking layer comprises at least one of zinc oxide and titanium dioxide.

13. A micro display, comprising an array of light emitting diode devices according to claim 1.

* * * * *